United States Patent
Heimlicher

(10) Patent No.: US 9,239,221 B2
(45) Date of Patent: Jan. 19, 2016

(54) PROXIMITY SENSOR

(71) Applicant: Peter Heimlicher, Fribourg (CH)

(72) Inventor: Peter Heimlicher, Fribourg (CH)

(73) Assignee: OPTOSYS SA (CH)

( * ) Notice: Subject to any disclaimer, the term of this patent is extended or adjusted under 35 U.S.C. 154(b) by 162 days.

(21) Appl. No.: 14/061,132

(22) Filed: Oct. 23, 2013

(65) Prior Publication Data
US 2014/0117979 A1    May 1, 2014

(30) Foreign Application Priority Data
Oct. 29, 2012 (EP) ..................................... 12190395

(51) Int. Cl.
| | |
|---|---|
| *G01R 27/28* | (2006.01) |
| *G01B 7/14* | (2006.01) |
| *H03K 17/95* | (2006.01) |
| *G01D 11/24* | (2006.01) |
| *H01L 23/047* | (2006.01) |
| *H01L 23/31* | (2006.01) |

(52) U.S. Cl.
CPC ................ *G01B 7/14* (2013.01); *G01D 11/245* (2013.01); *H03K 17/9505* (2013.01); *H01L 23/047* (2013.01); *H01L 23/3135* (2013.01); *H01L 2224/45144* (2013.01); *H01L 2224/49171* (2013.01)

(58) Field of Classification Search
CPC ..... G01R 27/28; G01D 11/245; G01D 11/24; H03K 17/9505; G01B 7/14; G01B 7/30; G01B 7/023; G01V 3/104; H05K 3/366

USPC .......................................... 324/207.15–207.26
See application file for complete search history.

(56) References Cited

U.S. PATENT DOCUMENTS

| | | | | |
|---|---|---|---|---|
| 5,789,920 | A * | 8/1998 | Gass ............................. 324/260 |
| 7,825,655 | B1 * | 11/2010 | Stabel et al. ............. 324/207.15 |
| 2004/0010910 | A1 * | 1/2004 | Farrell et al. ..................... 29/830 |
| 2011/0187353 | A1 * | 8/2011 | Mizusaki et al. ........ 324/207.11 |
| 2011/0266042 | A1 * | 11/2011 | Beaman ........................ 174/261 |

FOREIGN PATENT DOCUMENTS

EP           0 492 029        7/1992

* cited by examiner

*Primary Examiner* — Son Le
(74) *Attorney, Agent, or Firm* — Ostrolenk Faber LLP

(57) ABSTRACT

The present disclosure relates to a proximity sensor having a coil (15) for generating a magnetic field and a sensor circuit (62) for detecting variations of the magnetic field caused by an external object, the sensor circuit (62) comprising at least one semiconductor component (36, 37, 67, 69, 70, 71) mounted on a circuit board (17), wherein the coil (15) and the circuit board (17) are arranged in a housing (2) through which the magnetic field is transmittable. In order to improve the resistance of the proximity sensor against harmful external influences, such as high temperatures, and to prolong its life cycle, the invention suggests that the semiconductor component (36, 37, 67, 69, 70, 71) is included in an enclosure (20) that is hermetically sealed and fixed on a surface (18, 19) of the circuit board (17).

17 Claims, 3 Drawing Sheets

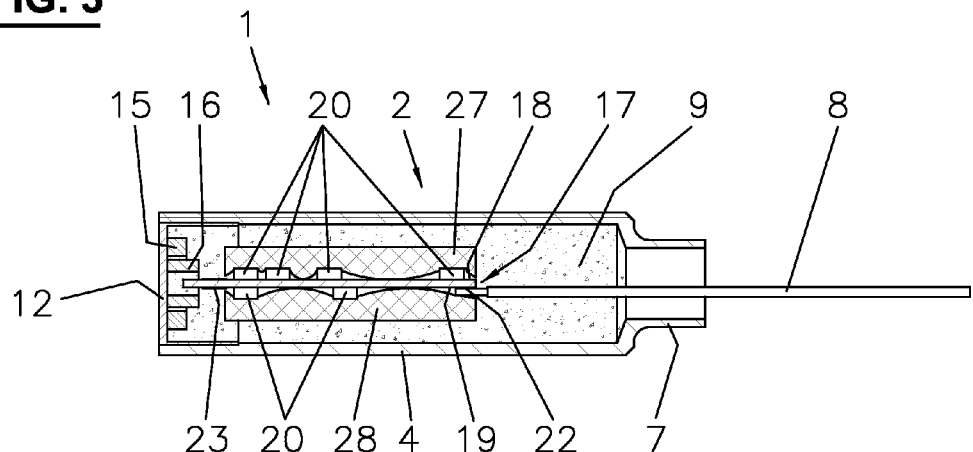
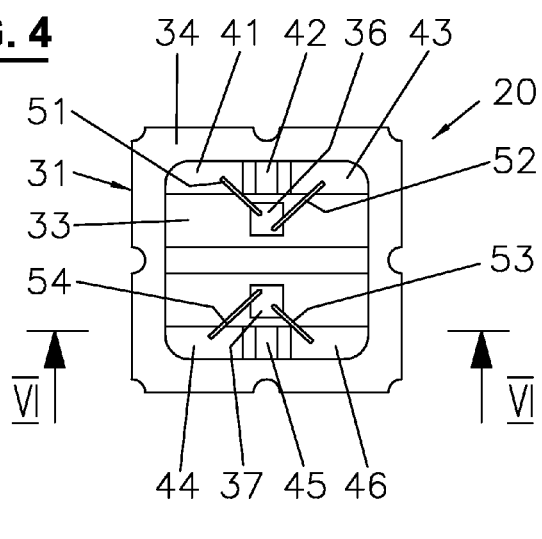
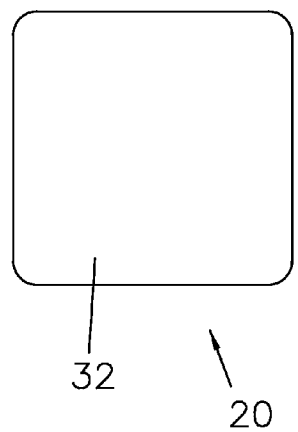
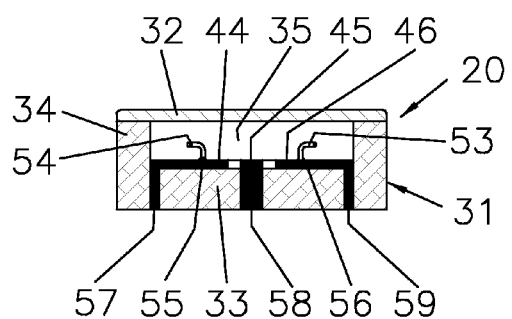

PROXIMITY SENSOR

TECHNICAL FIELD OF THE INVENTION

The present invention relates to a proximity sensor having a coil for generating a magnetic field and a sensor circuit for detecting variations of the magnetic field caused by an external object. The sensor circuit comprises at least one semiconductor component mounted on a circuit board, wherein the coil and the circuit board are arranged in a housing through which the magnetic field is transmittable.

BACKGROUND OF THE INVENTION

A conventional inductive proximity sensor of that type includes a coil in an oscillator circuit, generating a magnetic field that emanates from a sensing face of the sensor housing into a desired sensing area. Movements of an external object inside the sensing area or into the sensing area can be detected by the sensor circuit based on variations of the magnetic field caused by the object. More precisely, the magnetic energy absorbed by the object and/or interactions of the emanating magnetic field with a magnetic field caused by eddy currents generated in the object are exploited for object detection.

An alternate version of such an inductive proximity is disclosed in EP-A 0 492 029. The proximity sensor includes a coil that is supplied with periodic current pulses to generate a magnetic field that emanates into the sensing area. Due to the emanating magnetic field, voltages can be induced in an external object which provoke a decaying current in the object after the end of a periodic current pulse in the proximity sensor. The decaying current in the external object in turn induces a voltage in the coil of the proximity sensor after the respective periodic current pulse. Corresponding measurement signals of these induced voltages allow a detection of movements of the external object inside the sensing area or into the sensing area.

The widespread usage of these sensors for various sensing functions, in particular in connection with industrial plants or machinery such as robot systems, assembly systems, material handling systems, etc., makes it desirable to achieve a better performance and reliability with respect to various device characteristics including temperature resistance, contamination protection and lifetime cycle.

It is therefore an object of the present invention to improve at least one of the above mentioned deficiencies and to provide the initially addressed proximity sensor so as to provide a higher resistance against harmful external influences, such as high temperature and contamination, and/or to prolong its life cycle and reliability.

SUMMARY OF THE INVENTION

This object is achieved by the proximity sensor according to claim 1. The dependent claims define preferred embodiments.

Accordingly, the invention proposes that the semiconductor component is included in a hermetically sealed enclosure that is fixed on a surface of the circuit board. The enclosure can provide a protection for the semiconductor component against external impacts on the proximity sensor and can contribute to extend its life cycle. In particular, thermal degradation and/or corrosion effects at the semiconductor crystal of the semiconductor component and on the semiconductor component wiring can be advantageously reduced by the provision of such an enclosure. Subsequently, the hermetically sealed enclosure containing the at least one semiconductor component is referred to as enclosure.

Notably, it has been realized in the course of the present invention that one of the components of the proximity sensor that is particularly sensitive against harmful external influences can by constituted by semiconductor components included in the sensor circuit. Thus, specific provisions are proposed that can be used to protect this weak point from the detrimental external impacts mentioned above.

In the present context, the term semiconductor component in particular refers to a semiconductor device, such as a transistor or a diode, and more generally to any other component that exploits the electronic properties of a semiconductor material contained therein. For instance, the term semiconductor component also refers to an integrated circuit comprising one or more semiconductor devices. In a preferred application, at least one semiconductor component is provided by a transistor representing a particularly susceptible element of a proximity sensor.

Subsequently, various features for a further improvement of the capability of resistance and/or durability of the proximity sensor and the electronic components contained therein are described.

Preferably, the enclosure is under vacuum or filled with an inert gas and the enclosure is hermetically sealed to maintain an inert or vacuum atmosphere. In this way, a good protection against corrosion and external contamination can be achieved and the operational life and reliability of the sensor under exposure to high temperature and thermal cycles can be improved. Preferably, the enclosure is filled with nitrogen in order to provide the inert atmosphere. Alternatively, a vacuum atmosphere inside the enclosure is conceivable.

Preferably, the enclosure comprises a lid. The lid can be used to delimit a hermetically sealed volume inside the enclosure and/or to provide an additional upper mechanical protection of the semiconductor component. More preferred, the lid is metallic or ceramic. A metallic or ceramic lid offers the advantage of an easy installation combined with a good protection and/or hermetic sealing.

Preferably, the enclosure comprises a support section with a side on which the semiconductor component is fixed and with an opposed side fixed to the circuit board. The support section preferably consists of a material that matches the thermal expansion of the circuit board, in particular the mechanical temperature coefficient of the circuit board, by a deviation of at most 50 ppm/° C., more preferred at most 10 ppm/° C. The matching of the temperature coefficient can be exploited to prevent damage to the proximity sensor induced by thermal cycling at increased operation temperature.

The term mechanical temperature coefficient, which may also be referred to as thermal expansion coefficient or thermal expansion linear coefficient, is to be understood as the relative change of the respective mechanical dimension when the temperature is changed by 1 K.

The match of the mechanical temperature coefficient between the support section of the enclosure and the circuit board is preferably provided at least over a range of an intended operation temperature of the proximity sensor. The temperature range may comprise, for instance, an upper temperature value of at least 180° C., more preferred at least 250° C., and/or a lower temperature value of at most 0° C., more preferred at most −25° C. Preferably, the respective thermal expansion, as represented for instance by the mechanical temperature coefficient, is substantially constant over the intended operation temperature range.

Preferably, the material of the enclosure comprises exclusively inorganic materials, e.g. ceramics, metal and/or glass.

A particularly preferred material to achieve the advantageous match of the thermal expansion between the support section of the enclosure and the circuit board comprises a ceramics provided on the support section of the enclosure. More preferred, at least the support section of the enclosure entirely consists of the ceramics.

Suitable materials for the circuit board comprise thermo resistant plastics, ceramics, glass and enameled metal. A preferred material of the circuit board to match the thermal expansion with the support section of the enclosure comprises a thermo resistant polyimide. More preferred, a poly(diphenyl oxide)-pyromellitimide (or poly(4,4'-oxydiphenylene-pyromellitimide)) is used. This material is also known as "Kapton"® and offers the advantages of an applicability over a large temperature range, e.g. from below −200° C. up to 400° C., no inflammability and no melting point. Preferably, the circuit board also comprises a reinforcement material, preferably a glass material, to provide a more suitable thermal expansion and higher mechanical stability.

Preferably, the sensor circuit comprises at least two semiconductor components thermally coupled to one another. Preferably, the thermal coupling between the semiconductor components is provided by a thermal connection material between the semiconductor components, allowing a temperature exchange between the semiconductor components. Preferably, the enclosure comprises the thermal connection material. Preferably, the thermal connection material is an inorganic material, more preferred a ceramics. In such a way, leakage currents occurring at high operation temperatures can be counterbalanced.

According to a preferred configuration, at least two transistors are thermally coupled to one another. Thus, a balanced circuitry of differential transistor-pairs, triplets or a higher number of transistors or more generally an equivalent circuitry containing several semiconductor components can be provided to prevent adverse effects due to leakage currents at high operation temperatures of the proximity sensor. Thereby, at least two coupled semiconductor components are preferably included in the sensor circuit in a parallel arrangement. More preferred, the semiconductor components are mutually coupled via a connection between their respective base terminals and/or emitter terminals. In particular, an arrangement of transistors in balanced pairs in the sensor circuit is conceivable, to counteract the leakage currents occurring at high temperature. For instance, the emitter pad of one transistor can be connected to the base pad of a subsequent transistor. More generally, differential pairs, triplets or a higher number of semiconductor components operating in parallel or in series or in a hybrid arrangement of a parallel and series connection is conceivable, wherein a parallel arrangement of at least two semiconductor components is preferred to achieve a higher temperature stability.

Preferably, the at least two semiconductor components thermally coupled to each other are included in the same enclosure. More preferred, a separate enclosure is provided for each number of mutually thermally coupled semiconductor components and/or each single semiconductor component provided on the circuit board. In this way, a compact arrangement of the semiconductor components in the sensor circuit can be achieved, wherein a good protection against external impacts and a high temperature insensitivity can be provided for each thermally coupled semiconductor component arrangement.

More generally, substantially all semiconductor components, or at least all temperature and/or contamination sensitive semiconductor components, mounted on the circuit board are preferably included in an enclosure. Thereby, one, several or all semiconductor components can be included in a single enclosure or in several enclosures fixed on the surface of the circuit board. Preferably, at least two enclosures in which at least one semiconductor component is included are fixed on the surface of the circuit board. More preferred, a separate enclosure is provided on the surface of the circuit board for essentially each temperature and/or contamination sensitive semiconductor component and/or each number of mutually thermally coupled semiconductor components. In this way, a separate protection of individual semiconductor device arrangements can be achieved allowing a decrease of the sensitivity of the entire sensor circuit against contaminations and temperature effects at local points with a higher susceptibility to damage.

Preferably, the sensor circuit further comprises electronic components, e.g. resistors, capacitors, thermistors, etc., mounted on the circuit board externally from the semiconductor component enclosure. The external electronic components preferably comprise inorganic materials, in particular a ceramics. This can further contribute to improve the temperature insensitivity of the proximity sensor, in particular due to the matching of the temperature coefficient between the circuit board and the sensor circuit.

Preferably, substantially only inorganic components are provided on the circuit board and/or inside the enclosure. More preferred, no synthetic or plastic components are provided on the circuit board and/or inside the enclosure. Most preferred, exclusively ceramic and/or semiconductor and/or metallic components are arranged on the circuit board and/or in the enclosure. Preferably, the circuit board itself only consists of thermoresistant material components. Preferably, the electric conductors connecting the components on the circuit board are at least partially attached to a surface of the circuit board and plated with a noble metal, preferably gold.

To electrically connect the at least one semiconductor component included in the enclosure to the circuit board, the enclosure preferably comprises at least two connection pads that are electrically connected to a conductor on the circuit board. In particular, corresponding contacts on the enclosure bottom which are in electrical contact with connection pads inside the enclosure are preferably attached to respective contacts on the circuit board.

Preferably, the electrical connection between at least one pad of the semiconductor component and the connection pad of the enclosure inside the enclosure is made by a thermo compression bonding. A gold wire is preferably used as a connection. Preferably, at least one connection pad comprises a gold metallization layer. These measures with respect to the electrical connection of the semiconductor component to the circuit board can further contribute to an improved high temperature resistance of the proximity sensor, and can in particular contribute to a matching of the temperature coefficient of the circuit board and the enclosure with the at least one semiconductor component contained therein. Further, the use of a single type of metal can reduce the effects of ion migration at the junction of metallic parts.

Preferably, the circuit board is surrounded by a molding compound. On the one hand, the molding compound can provide an encapsulation of the circuit board for an additional protection against high temperature, contamination and mechanical impacts. On the other hand, the molding compound can be used to provide an additional fixation of the enclosure and/or other components on the circuit board. Moreover, the molding compound can prevent or delay an oxidation of metallic parts, in particular metallic connections, due to the presence of gases at high temperatures. Preferably, a flexible molding compound is applied. More preferred, the molding is an epoxy. Most preferred, a high temperature epoxy, in particular with a glass transition temperature Tg of at least 150° C., is applied.

To provide an additional protection for the enclosure and/or other electronic components fixed on the circuit board, a volume filler is preferably arranged in between the molding compound and at least a part of a surface of the circuit board. Preferably, the volume filler is arranged on a surface on both sides of the circuit board. The volume filler is preferably constituted by a compressible spatially extended object in order to fill out an inner volume between the molding compound and at least a part of the respective surface of the circuit board. Preferably, the volume filler comprises a thickness exceeding the vertical height of the enclosure and/or other electronic components projecting from a surface of the circuit board, preferably by at least a factor of two. More preferred, the volume filler comprises a thickness exceeding the combined thickness of the circuit board and the enclosure and/or other electronic components projecting from a surface of the circuit board, preferably by at least a factor of two.

Preferably, at least the outer surface of one enclosure or the outer surface of several enclosures or the outer surface of each enclosure containing a semiconductor component is overlaid with the volume filler. More preferred, substantially the total surface portion of the circuit board that is provided with electronic components is overlaid with the volume filler.

Preferably, the volume filler comprises a flexible material, in particular to be adaptable and/or shapeable with respect to an uneven surface portion of the circuit board at which the enclosure and/or other components are projecting. Such a shape customization of the volume filler can be advantageous to substantially fully encompass the enclosure and/or other components by the volume filler in order to reduce the volume occupied by the molding compound. It has been realized in the course of the present invention that such a reduction of the molding compound volume is desirable, since the molding compound may exhibit a larger mechanical temperature coefficient and thus may contribute to a significant internal pressure increase. This can be avoided by constraining the volume occupied by the molding compound. The flexibility of the volume filler can also be advantageous to ensure absorption of a thermal expansion stress of the components and it can allow a better protection of the electronic components against mechanical impacts on the proximity sensor. The volume filler may also comprise at least two layers stacked on top of each other, in particular on each side of the circuit board, for an even higher compensation of thermal expansion effects or mechanical impacts.

Preferably, the volume filler comprises a synthetic rubber foam, in particular a fluoropolymer elastomer, which is currently also known under the name "Viton"®. Such a material is particularly suited as volume filler with the above mentioned advantages, in particular in view of shapeability, absorption of thermal expansion stress and temperature, contamination and shock resistance.

According to a preferred configuration, the volume filler directly adjoins the enclosure and/or other components on the circuit board. During fabrication of the proximity sensor, the volume filler is preferably disposed on the respective upper and/or lower surface of the circuit board. Then, a slight pressure is preferably applied on the volume filler to achieve a tight fit around the enclosure and/or other components on the circuit board. A fixation of the volume filler in its tight position on the circuit board is preferably provided by a foil or tape wrapped around the volume filler and the circuit board. Preferably, the foil or tape comprises polytetraflourethylene (PTFE), also known as "Teflon"®, or a thermoplastic polymer with similar properties. After the molding process, an additional fixation of the volume filler on the circuit board can be provided by the surrounding molding compound.

Preferably, substantially the complete inner volume of the housing of the proximity sensor is filled out by the molding compound and/or the volume filler surrounding the circuit board and the components thereon. In this way, contamination of the inner volume can be effectively avoided and a high liquid tightness and/or gas tightness can be achieved. Such a provision of the molding compound and/or the volume filler can also serve as an additional fixation of the electronic components mounted on the circuit board and/or electric conductors printed on the circuit board, in particular during a high temperature operation of the proximity switch in which the direct fixations on the circuit board are weakened.

Preferably, the coil for generating the emanating magnetic field is arranged in a frontal part of the housing of the proximity sensor, more preferred in direct connection with a front wall of the housing through which the magnetic field is transmittable, wherein the outer surface of the front wall may constitute the active area of the proximity sensor. The circuit board is preferably arranged behind the coil in such a manner, that an imaginary extension of the circuit board in the longitudinal direction of the proximity sensor intersects a diameter of the coil.

Preferably, a core comprising a magnetic material with a high permeability, in particular a ferrite or iron powder core, is arranged inside the coil. Preferably, the core material exhibits a Curie temperature Tc of at least 200° C., more preferred at least 300° C., to avoid performance degradations at higher operation temperatures of the proximity sensor. Preferably, the coil and the inner core are ring shaped.

Preferably, the housing consists of stainless steel, more preferred austenitic stainless steel. This material offers a solid protection against mechanical shocks and has the additional advantage of a thermal expansion that can be matched with the molding compound. In particular, the housing may exhibit a thermal expansion, as represented for instance by a mechanical temperature coefficient, of approximately 15 to 20 ppm/° C., for instance approximately 17 ppm/° C., in particular over a temperature range of at least in between 0° C. and 250°. Alternatively, ferritic stainless steel is preferred if low electrical losses in the housing are most important.

Preferably, the housing is cylindrical in order to provide an inner geometry that is suitable for receiving the circuit board and an amount of the molding compound and volume filler that allows a good protection of the circuit board. The housing may consist of a single piece or may be composed of several pieces. In particular, the housing may comprise a substantially cylindrical housing body comprising a closed front end or comprising an open front end. In the latter case, a front cap constituting a front wall with the active area of the switch is preferably provided.

A preferred operation temperature range of the above described proximity sensor can comprise a temperature of at least 180° C., more preferred at least 250° C.

BRIEF DESCRIPTION OF THE DRAWINGS

The invention is explained in more detail hereinafter by means of preferred embodiments with reference to the drawings which illustrate further properties and advantages of the invention. The figures, the description, and the claims comprise numerous features in combination that one skilled in the art may also contemplate separately and use in further appropriate combinations. In the drawings:

FIG. 3 is a longitudinal sectional view of the proximity sensor shown in FIGS. 1 and 2;

FIG. 4 is a top view of an enclosure for semiconductor components without lid;

FIG. 5 is a top view of the enclosure shown in FIG. 4 comprising a lid;

FIG. 6 is a cross-sectional view of the enclosure shown in FIGS. 4 and 5 along VI.

DESCRIPTION OF EMBODIMENTS

Figure 1:
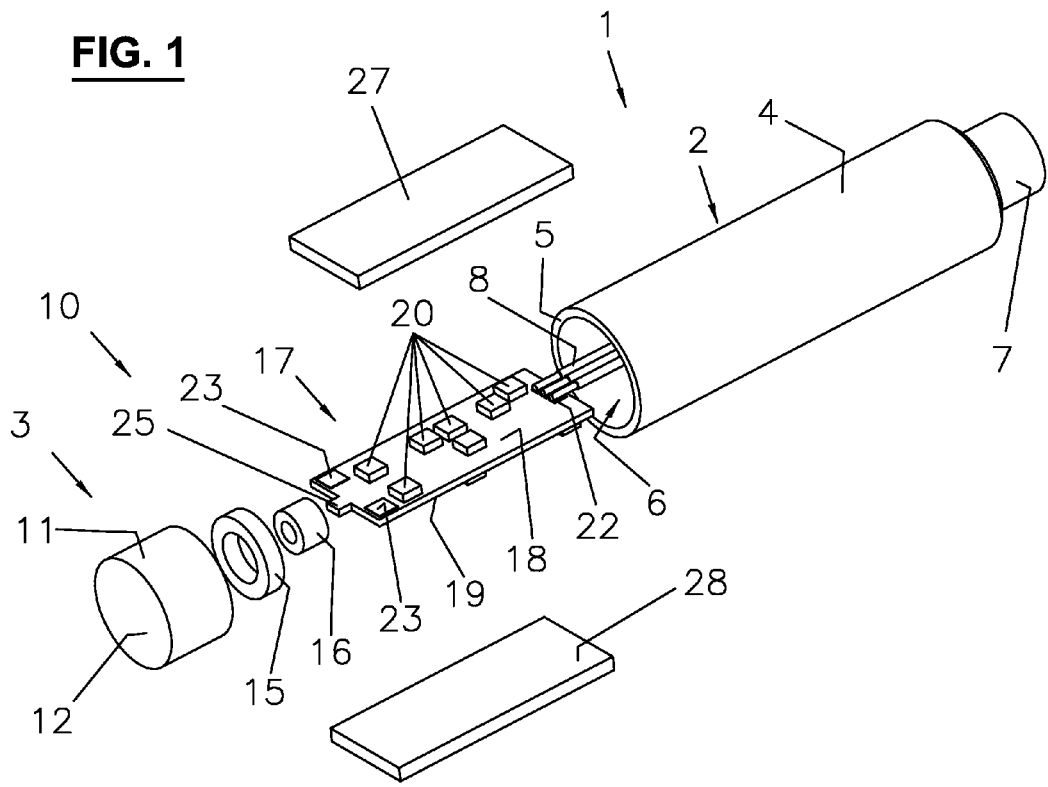
FIG. 1 is an exploded view of a proximity sensor according to the invention.
Figure 2:
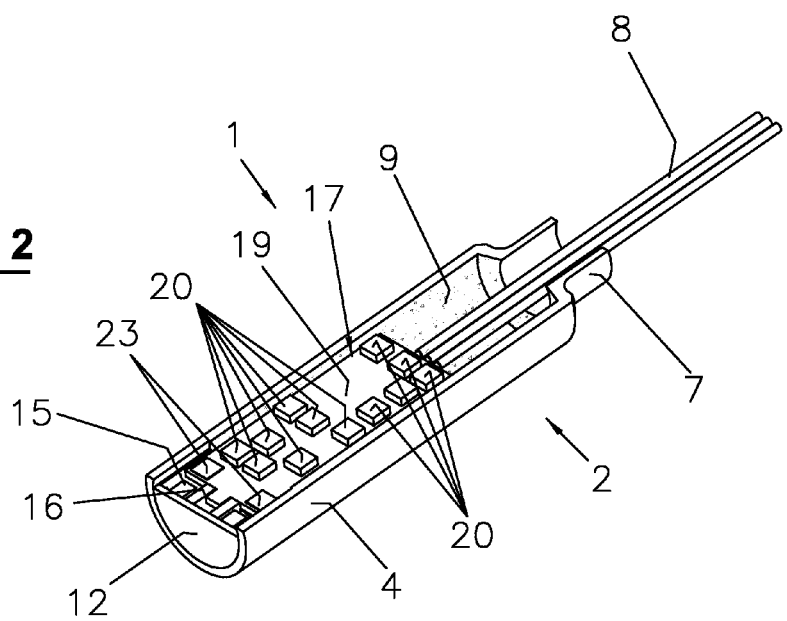
FIG. 2 is a perspective view of a longitudinal intersection through the proximity sensor shown in FIG. 1.

FIGS. 1 to 3 show an inductive proximity sensor 1, also referred to as a proximity switch, comprising a housing 2 that is closed by a front cap 3. Housing 2 comprises a body portion 4 that is substantially cylindrical with an open front end 5 giving access to an inner space 6 for receiving electronic constituents 10 of proximity sensor 1.

The back end of housing 2 is constituted by a rear portion 7 with a reduced diameter defining a central opening through which several electric lines 8 can be led from inner space 6 to an outer region. Housing body 4 consists of austenitic stainless steel with a thermal expansion, as represented by a mechanical temperature coefficient, of approximately 17 ppm/° C. substantially matching with the thermal expansion of a molding compound 9 provided inside housing 2.

Front cap 3 has a cylindrical side wall 11 with an outer diameter substantially corresponding to the inner diameter of body portion 4 allowing a precise fitting into front end 5 of housing 2. A permanent fixation of front cap 3 inside body portion 4 is provided by a molding compound. The frontal end of front cap 4 is covered by a front wall 12. The outer surface of front wall 12 constitutes an active area of proximity sensor 1 through which a magnetic field can be emanated. The active area is aligned in the longitudinal direction of housing 2 to front end 5 of housing 2.

Electronic constituents 10 of proximity sensor 1 comprise a coil 15 with a ferrite core 16 and a circuit board 17 with an upper and a lower surface 18, 19 on which a sensor circuit is arranged.

Coil 15 is ring shaped and substantially directly adjoins the inner surface of front wall 12. Ferrite core 16 is also ring shaped and its outer diameter essentially corresponds to the inner diameter of coil 15. The longitudinal length of ferrite core 16 slightly exceeds the longitudinal length of coil 15 such that ferrite core 16 protrudes from the inner circumference of coil 15 towards the rear side of housing 2. The ferrite material of core 16 exhibits a Curie temperature Tc of above 300° C. In this way, performance degradations of ferrite core 16 at higher operation temperatures can be circumvented.

The sensor circuit provided on circuit board 17 comprises separate enclosures 20, each fixed on upper or lower surface 18, 19 of circuit board 17 and non-uniformly distributed over surfaces 18, 19. In this way, at least one semiconductor component contained in each enclosure 20 is mounted on circuit board 17. In the present example, the at least one semiconductor component inside enclosure 20 is provided by a transistor.

Several contact areas 22, 23 are provided on surfaces 18, 19 of circuit board 17 allowing establishing an electrical connection with the sensor circuit. In particular, rear contacts 22 are centrally arranged on a rear portion of surface 18 and front contacts 23 are laterally arranged on a front portion of surface 18. Contact areas 22, 23 comprise a gold metallization layer to avoid performance degradations of the electrical connection to contacts 22, 23 at higher operation temperatures.

Rear contacts 22 are connected to electric lines 8. Electric lines 8 serve to supply the sensor circuit on circuit board 17 with electric power and to transmit an output signal generated in the sensor circuit based on detected variations of the magnetic field emanated by coil 15, in particular magnetic variations induced by an external object inside the sensing area of the emanated magnetic field. Electric lines 8 comprise three cables. In another preferred embodiment of electric lines 8, two or four cables can be provided.

Front contacts 23 are used to establish an electrical connection of the sensor circuit on circuit board 17 to coil 15, in particular to supply coil 15 with electric power for the magnetic field generation and to allow a detection of changes of the magnetic field induced by an external object.

Figure 7:
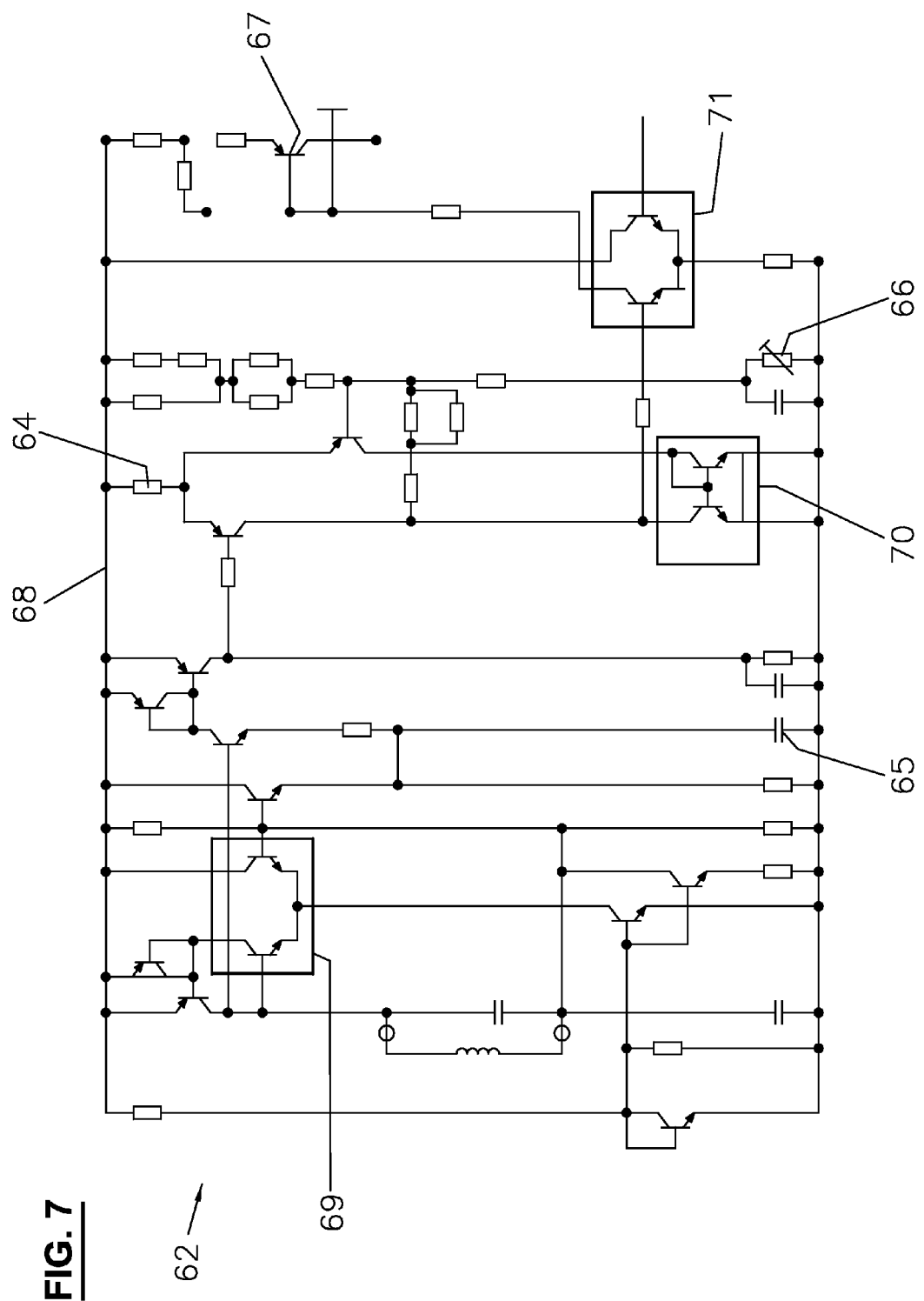
FIG. 7 is a schematic diagram of a part of a sensor circuit.

The sensor circuit on circuit board 17 comprises further electrical components which are not shown in FIGS. 1-3. A part of an exemplary circuit diagram of the sensor circuit, in which an entity of electrical components arranged on circuit board 17 is schematically depicted, is illustrated in FIG. 7 and described further below. Except for the conductors interconnecting the electronic components, substantially all electronic components of the sensor circuit arranged outside enclosures 20 on circuit board 17, consist of a ceramics or conductor material. In this way, performance degradations of proximity sensor 1 at higher operation temperatures can be further minimized.

Circuit board 17 consists of a poly-(diphenyl oxide)-pyromellitimide, also referred to as "Kapton"®, that is reinforced with a fibrous glass material to provide a higher mechanical stability. The usage of these thermoresistant materials allows a further improvement for avoiding temperature induced degrading effects and it allows to match the thermal expansion of the circuit board 17 with the temperature coefficient of the electronic components arranged on the circuit board 17, in particular of enclosures 20. In particular, a uniform mechanical temperature coefficient of approximately 10 ppm/° C. can thus be provided over a large temperature range.

On upper and lower surface 18, 19 of circuit board 17, a respective volume filler 27, 28 is arranged. The length and width of volume filler 27, 28 substantially corresponds to the length and width of surfaces 18, 19 on which electronic components are provided. Thus, essentially all electronic components of the sensor circuit, in particular enclosures 20, are covered by volume filler 27, 28. The thickness of each volume filler 27, 28 exceeds the combined thickness of circuit board 17 and enclosures 20 vertically protruding from the respective surfaces 18, 19 by more than a factor of two. Thus a spatial extension of the volume filler 27, 28 in a vertical direction in which the electronic components stick out from circuit board 17 is provided, allowing a good protection against mechanical impacts, heat and contamination.

Upper volume filler 27 and lower volume filler 28 consist of a synthetic rubber in the form of a fluoropolymer elastomer, also referred to as "Viton"®. One of the material properties is its flexibility, allowing an adaptation to the shape of unhomogenous surfaces 18, 19, when the electronic components including enclosures 20 are mounted thereon. This allows volume filler 27, 28 to substantially directly adjoin enclosures 20 and other electronic components on circuit board 17 not only at their top faces but even at their lateral faces. Moreover, this allows volume filler 27, 28 to substantially directly adjoin circuit board 17 at intermediate surface portions at which no enclosures 20 and no other electronic components are projecting from circuit board 17.

Other advantages of the fluoropolymer elastomer comprised in volume filler 27, 28 are good isolation properties against heat, shocks and contamination and the ability to absorb a thermal expansion stress of the electronic components on circuit board 17 at higher operation temperatures. To provide the advantageous shape adaptation of volume filler 27, 28 with respect to surfaces 18, 19 of circuit board 17, volume filler 27, 28 is subjected to pressure against surfaces 18, 19 and fixed in this position by application of a "Teflon"®-tape.

A further fixation of volume filler 27, 28 on circuit board 17 is achieved by a subsequent overmolding of volume filler 27, 28 with circuit board 17 sandwiched in between by application of molding compound 9. During the overmolding procedure, volume filler 27, 28 can already serve as a mechanical protection of the electronic components on circuit board 17. In contrast, if molding compound 9 would be directly applied on the electronic components on circuit board 17, the overmolding procedure could constitute a possible risk of damage.

Molding compound 9 is a high temperature epoxy with a glass transition temperature Tg over 150° C. in order to further increase the resistivity against high temperature impacts. After the molding process, substantially the complete inner volume 3 of housing 2 is filled out by molding compound 9 and volume filler 27, 28 surrounding circuit board 17 and the components thereon.

Due to the cylindrical geometry of housing 2 as compared to the flat shape of circuit board 13, the volumetric content of molding compound 9 and volume filler 27, 28 is comparatively large. Thus, the risk of contamination of inner volume 3 is largely decreased and a good heat isolation is provided.

FIG. 4 depicts enclosure 20, wherein a lid 32 on top of enclosure 20 (as shown in FIG. 5) is removed, in order to illustrate the internal configuration of enclosure 20. Enclosure 20 comprises a ceramic body 31. A base of ceramic body 31 is formed by a flat support section 33. Outer side walls 34 vertically delimit an inner volume 35 inside enclosure 20. Ceramic body 31 has a substantially quadratic cross-section.

Support section 33 is used as a support of two semiconductor devices 36, 37, more particularly transistors. Transistors 36, 37 are neighboring each other and fixed on the upper surface of support section 33. Three first connection pads 41, 42, 43 are arranged on support section 33 next to first transistor 36. Three second connection pads 44, 45, 46 are arranged on support section 33 next to second transistor 37. First connection pads 41, 42, 43 and second connection pads 44, 45, 46 are each successively arranged at opposite sides of support section 33 such that transistors 36, 37 are arranged in between. All connection pads 41, 42, 43, 44, 45, 46 comprise a gold metallization layer.

Via respective gold wires 51, 52, the collector terminal and base terminal of first transistor 36 is connected to the two outer connection pads 41, 43 of first connection pads 41, 42, 43. Via respective gold wires 53, 54, the collector terminal and base terminal of second transistor 37 is connected to the two outer connection pads 44, 46 of second connection pads 44, 45, 46. In this way, a parallel circuitry arrangement of the pair of transistors 36, 37 in the sensor circuit provided on circuit board 17 is realized.

The emitter terminals of both transistors 36, 37 are mutually interconnected and the interconnection is arranged in a series connection with the sensor circuit on circuit board 17. Both transistors 36, 37 are arranged on support section 33 of ceramic body 31. Thus, ceramic body 31 constitutes a thermal connection material between transistors 36, 37. In this way, a balanced transistor-pair circuitry is provided inside enclosure 20 which allows to prevent adverse effects of high leakage currents occurring at higher operation temperatures of the sensor circuit.

FIG. 5 depicts enclosure 20, wherein lid 32 is attached on top of enclosure 20. Lid 32 is metallic and is applied on enclosure 20 after the internal wiring of transistor pair 36, 37 has been carried out. The metallic composition of lid 32 is suitable for an easy installation and can offer a good mechanical protection and a tight sealing of the inner volume 35 of enclosure 20.

FIG. 6 shows a cross-sectional view of enclosure 20 shown in FIG. 5 at the position of the attachment of gold wires 53, 54 on connection pads 44, 46 shown in FIG. 4. Gold wires 53, 54 are attached to the gold metallization layer of connection pads 44, 46 via a thermocompression bonding 55, 56. In this way, the resistance against heating induced degradation and corrosion is further improved.

Second connection pads 44, 45, 46 are electrically connected to respective bottom contacts 57, 58, 59 on the lower surface of support section 31. Corresponding bottom contacts are provided for first connection pads 41, 42, 43. Enclosure 20 is fixed on respective surface 18, 19 of circuit board 17. Thereby, bottom contacts 57, 58, 59 are attached to respective contacts on circuit board 17 by a high temperature solder. In this way, a good corrosion and heating resistant fixation of enclosure 20 on circuit board 17 is provided. The fixation on circuit board 17, in particular during high temperature operation of proximity sensor 1, is further improved after the application of volume filler 27, 28 and molding compound 9 around circuit board 17.

After fixation of enclosure 20 on circuit board 17, substantially only support section 34 of enclosure 20 is in direct contact with surface 18, 19 of circuit board 17. Thus, the thermal expansion between enclosure 20 and circuit board 17 can be advantageously matched due to the advantageous material selection of circuit board 17 and enclosure 20. Moreover, ceramic body 31 provides an advantageous thermal coupling in between transistors 36, 37.

Inner space 35 of enclosure 20 is filled with nitrogen. Due to the tight sealing provided in between ceramic body 31 and metallic lid 32, the inert atmosphere inside inner space 35 can be maintained over a comparatively long time period. The inert atmosphere 35 leads to a further improvement of the avoidance of corrosion, contamination and thermoinduced degradation effects and contributes to a long lifetime of proximity sensor 1.

FIG. 7 depicts a circuit diagram of a sensor circuit 62 that can be provided on circuit board 17 of proximity sensor 1 shown in FIG. 1 to 3. Sensor circuit 62 comprises electronic components mounted on circuit board 17 externally from enclosures 20. These components comprise thermistors, resistors 64, 66 and capacitors 65, as indicated in FIG. 7 in an exemplary manner. All these components 64, 65, 66 are composed of ceramics and/or conductors. Other components comprising a semiconductor crystal, such as single transistors 67 and coupled transistor pairs 69, 70, 71, are arranged inside one of enclosures 20.

Thus, no plastic components but mostly ceramic components are provided on circuit board 17 externally from enclosures 20, except for conductors 68 interconnecting electronic components 64, 65, 66, 69, 70, 71 on circuit board 17 and conductors arranged inside electronic components, such as the conductors in inductive elements, etc. Conductors 68 interconnecting electronic components 64, 65, 66, 69, 70, 71 are printed on circuit board 17.

Thermally coupled transistor pairs 69, 70, 71, as indicated in FIG. 7 in an exemplary manner, are included in sensor circuit 62 in a parallel arrangement. Transistor pairs 69, 70, 71 are coupled via a connection of their emitter terminals. In transistor pairs 69, 71, the respective interconnection of emitter terminals is connected in series with sensor circuit 62. The coupling of transistor pair 70 also comprises an interconnection between the respective base terminals. The arrangement of transistor pairs 69, 70, 71 inside sensor circuit 62 is provided with respective connections of each collector terminal and/or base terminal to sensor circuit 62.

Transistor circuits 69, 70, 71 constitute differential pairs in which transistors are balanced in order to be less sensitive to leakage currents occurring at high operation temperatures of proximity sensor 1. All differential pairs 69, 70, 71 of sensor circuit 62 are included in one respective enclosure 20. In this way, a highly decreased temperature sensitivity of sensor circuit 62 is combined with a compact circuit design. Moreover, the particularly sensitive components 69, 70, 71 of sensor circuit 62 are individually protected against heat, corrosion contamination, and mechanical impacts.

From the foregoing description, numerous modifications of the proximity sensor according to the invention are apparent to one skilled in the art without leaving the scope of protection of the invention that is solely defined by the claims.

The invention claimed is:

1. A proximity sensor having a coil for generating a magnetic field and a sensor circuit for detecting variations of the magnetic field caused by an external object, the sensor circuit comprising at least one semiconductor component mounted on a circuit board, wherein the coil and the circuit board are arranged in a housing through which the magnetic field is transmittable;
wherein the semiconductor component is included in an enclosure that is hermetically sealed and fixed on a surface of the circuit board; and
wherein the enclosure comprises a support section with a side on which the semiconductor component is fixed and with an opposed side fixed to the circuit board, the support section consisting of a material that matches the temperature coefficient of the circuit board by less than 50 ppm/° C.

2. The sensor according to claim 1, wherein the enclosure is under vacuum or filled with an inert gas to maintain an inert atmosphere.

3. The sensor according to claim 1, wherein the enclosure substantially consists of one or more inorganic materials.

4. The sensor according to claim 3, wherein the housing comprises stainless steel.

5. The sensor according to claim 1, wherein the sensor circuit comprises at least two semiconductor components thermally coupled to one another, said thermally coupled semiconductor components being included in the enclosure.

6. The sensor according to claim 1, wherein at least two enclosures in which at least one transistor is included are fixed on the surface of the circuit board.

7. The sensor according to claim 1, wherein the sensor circuit comprises electronic components mounted externally from the enclosure on the circuit board, the electronic components substantially only comprising inorganic materials.

8. The sensor according to claim 1, wherein the enclosure comprises at least two connection pads electrically connected to a conductor on the circuit board, the semiconductor component being electrically connected to the connection pads, wherein the connection pads comprise a gold metallization layer.

9. The sensor according to claim 1, wherein the circuit board comprises a thermo resistant polyimide.

10. The sensor according to claim 9, wherein the circuit board comprises a poly-(diphenyl oxide)-pyromellitimide.

11. The sensor according to claim 1, wherein the circuit board is surrounded by a molding compound.

12. The sensor according to claim 3, wherein the coil comprises a core with a Curie temperature of at least 200° C.

13. The sensor according to claim 12, wherein said Curie temperature is at least 300° C.

14. The sensor according to claim 1, the support section consisting of a material that matches the temperature coefficient of the circuit board by less than 10 ppm/° C.

15. A proximity sensor having a coil for generating a magnetic field and a sensor circuit for detecting variations of the magnetic field caused by an external object, the sensor circuit comprising at least one semiconductor component mounted on a circuit board, wherein the coil and the circuit board are arranged in a housing through which the magnetic field is transmittable;
wherein the semiconductor component is included in an enclosure that is hermetically sealed and fixed on a surface of the circuit board;
wherein the circuit board is surrounded by a molding compound; and
wherein a compressible volume filler is arranged in between the molding compound and at least a part of a surface of the circuit board.

16. The sensor according to claim 15, wherein the volume filler comprises a synthetic rubber foam.

17. The sensor according to claim 16, wherein the volume filler comprises a fluoropolymer elastomer.

* * * * *